United States Patent [19]

Wright

[11] 4,308,126

[45] Dec. 29, 1981

[54] CATHODE SPUTTERING APPARATUS

[75] Inventor: Robert J. Wright, Tequesta, Fla.

[73] Assignee: United Technologies Corporation, Hartford, Conn.

[21] Appl. No.: 188,399

[22] Filed: Sep. 18, 1980

[51] Int. Cl.³ .............................................. C23C 15/00
[52] U.S. Cl. ................................. 204/298; 204/192 R
[58] Field of Search ............... 204/192 R, 192 C, 298; 118/723, 730, 50.1

[56] References Cited

U.S. PATENT DOCUMENTS 4,090,941 5/1978 Wright et al. ........................ 204/298
4,170,541 10/1979 Lamont, Jr. ......................... 204/298

Primary Examiner—Aaron Weisstuch
Attorney, Agent, or Firm—Stephen E. Revis

[57] ABSTRACT

Cathode sputtering apparatus for coating articles which are rotated within a vacuum sputtering chamber and which are electrically biased includes a shaft for supporting the articles to be coated, wherein the shaft is supported by a plurality of non-lubricated bearings disposed within the vacuum chamber, at least one of the bearings being designed to conduct electricity to the shaft, that bearing being a thrust bearing supported by and in electrical contact with a bearing support plate and having races and rolling elements preferably made from either molybdenum or tungsten which are very hard materials with low electrical resistivity.

5 Claims, 3 Drawing Figures

CATHODE SPUTTERING APPARATUS

The Government has rights in this invention pursuant to Contract No. F33615-78-C-5070 awarded by the Department of the Air Force.

DESCRIPTION

1. Technical Field

This invention relates to cathode sputtering apparatus.

2. Background Art

Cathode sputtering is a process known within the art for depositing a coating on the surface of an article. Deposition of a coating material on an article by cathode sputtering combines preferred properties of the coating material with the preferred properties of the substrate material to produce a composite structure with enhanced capabilities.

Cathode sputtering is conducted in a partial vacuum in the presence of an inert gas such as argon. In the practice of cathode sputtering, a coating material on a sacrificial cathode is bombarded by ionized gas atoms, causing a transfer of energy to the surface atoms of the coating material. The energized surface atoms eject from the sacrificial cathode into a sputtering zone where a portion of the ejected atoms is intercepted by the substrate or article to be coated. The intercepted atoms impinge upon the surface of the substrate and become adhered thereto. Continuous deposition on an atomic scale over a period of time produces an even, well-adhered film on the substrate. The deposition of high melting point materials, including even ceramics has been achieved.

As is shown in commonly owned U.S. Pat. No. 4,090,941 to Robert J. Wright et al, two spaced apart sacrificial cathodes are used, with the article to be coated being disposed in the sputtering zone defined between them. In the Wright et al patent, one sacrificial cathode is a center, post cathode, while the other is a cylindrical cathode concentric with the post cathode and spaced therefrom to define an annular sputtering zone therebetween. The articles to be coated are shown attached to the end of a shaft which is rotatable about its own axis within bearings disposed above the top plate of the vacuum chamber. The articles are thereby rotated within the sputtering zone during deposition to obtain a more uniform coating thereon.

As also described in the Wright et al patent, before applying the coating it may be desirable to bias the substrate by passing an electric current through the rotating shaft to the article. Initially, the substrate is biased positively to heat the substrate by electron bombardment to a preferred temperature, followed by biasing the substrate negatively to sputter clean the surface through argon ion bombardment. The sputter cleaned surface is then ready for deposition of the coating material. To obtain dense deposits of certain coating materials, (e.g. refractory materials) at moderate substrate temperatures, it may be necessary or desirable to bias the substrate negatively during the coating process so that it is continuously bombarded by gas ions and the coating material flux. If a higher than normal temperature is desired during the coating cycle it is usually necessary to apply a positive bias to the substrate.

Biasing the substrate requires passing electric current through the shaft support bearings into the shaft and thereupon into the substrate. Standard bearing materials, such as stainless steel or nickel or cobalt base superalloys, overheat from this current flow due to their relatively high electrical resistivity. Liquid lubricants cannot be used since they evaporate in this high temperature environment. Furthermore, if it is desired that the bearing operate within the vacuum chamber of the sputtering apparatus, this would also contribute to the overheating problem. In that case, even so-called non-lubricated bearings of standard materials would not perform well since they rely on a gas, such as air, for a lubricant.

In summary, under the conditions outlined, the prior art apparatus would be damaged as a result of factors such as (1) arc welding caused by arcing between the bearing and shaft, (2) overheating which causes galling of the mating parts due to lack of lubricant and softening of the material, and (3) diffusion bonding of the parts due to the vacuum environment coupled with high temperatures and lack of lubrication. A compact, cost-effective, cathode sputtering apparatus having all the desired features and none of the problems discussed above is needed, but is not taught or obvious from the presently known prior art.

DISCLOSURE OF INVENTION

One object of the present invention is a compact, cost-effective, cathode sputtering apparatus.

Accordingly, the present invention is a cathode sputtering apparatus including a shaft for supporting the article to be coated, wherein the shaft is supported by a plurality of non-lubricated bearings at least one of which conducts electricity to the shaft, said bearings being disposed in the vacuum chamber of the apparatus and including at least one thrust bearing supported by and in electrical contact with a support plate and having races and rolling elements each having an electrical resistivity of less than 6.0 microohm cm, a surface hardness of at least 190 Brinell, and a melting point of at least 2000° C.

In one embodiment of the present invention the thrust bearing and the shaft for supporting the articles to be coated are made from either molybdenum or tungsten. Both of these materials have very low electrical resistivity and very high hardness. The combination of these characteristics allow the article biasing current to pass through the bearing into the shaft without causing damage.

In a preferred embodiment the support for the shaft comprises a thermally conductive upper plate spaced from and connected to an electrically conductive lower plate by thermally conductive spacers. The shaft passes through a bushing in the upper plate and a bushing in the lower plate and through the thrust bearing disposed therebetween which is supported by and in electrical contact with the lower plate. The thrust bearing is made from either molybdenum or tungsten and provides the path of lowest electrical resistance from a power supply to the shaft. The bushings are made from a mixture of graphitized carbon and silver, the silver being added for hardness. With the major portion of the electrical current passing through the thrust bearing rather than the bushings, the bushings do not overheat and bind despite the lack of either a liquid or gaseous lubricant.

The foregoing and other objects, features and advantages of the present invention will become more apparent in the light of the following detailed description of preferred embodiments thereof.

BEST MODE FOR CARRYING OUT THE INVENTION

Figure 1:
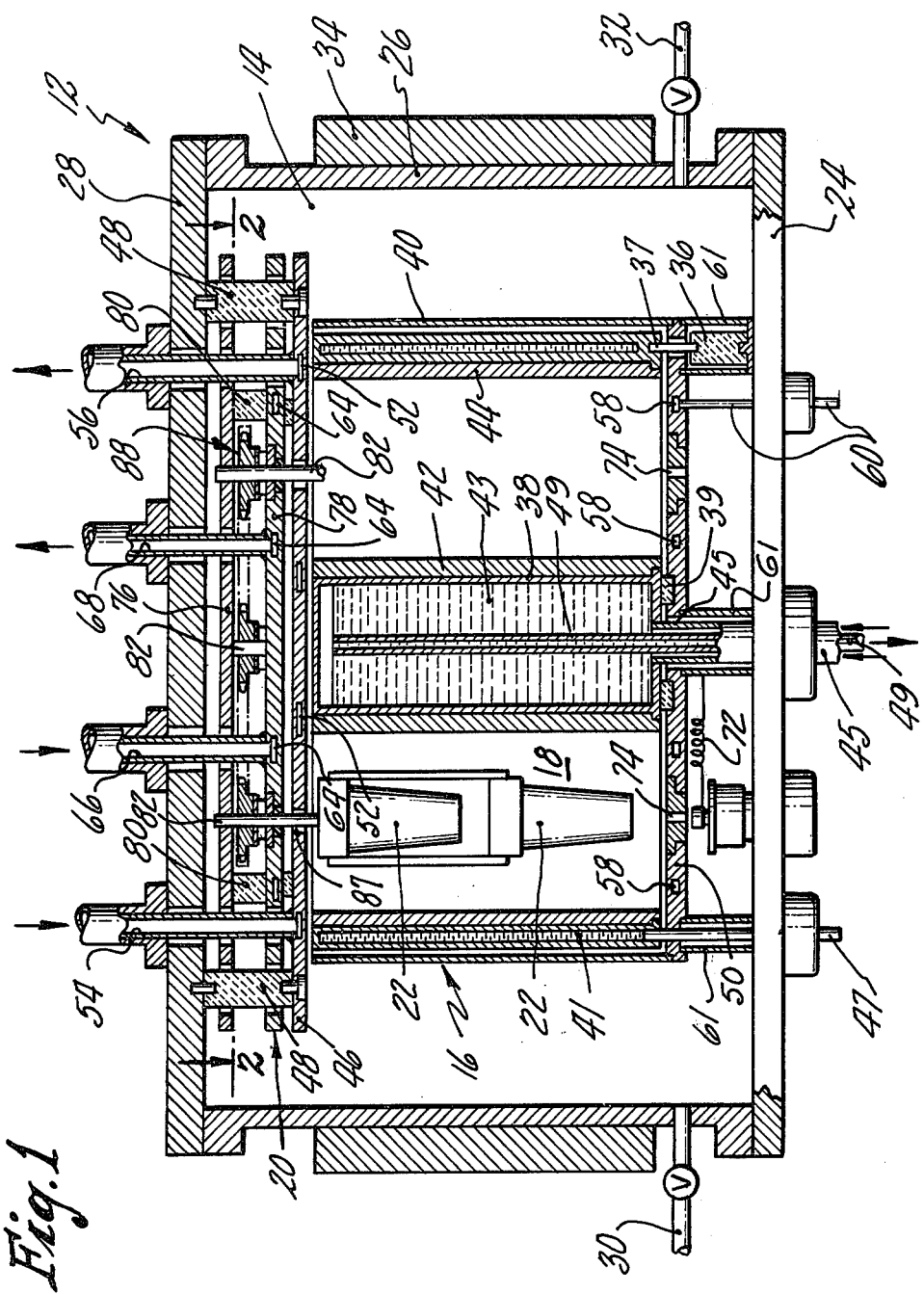
FIG. 1 is a cross-sectional view taken along the line 1—1 of FIG. 2 and shows cathode sputtering apparatus according to the present invention.
Figure 2:
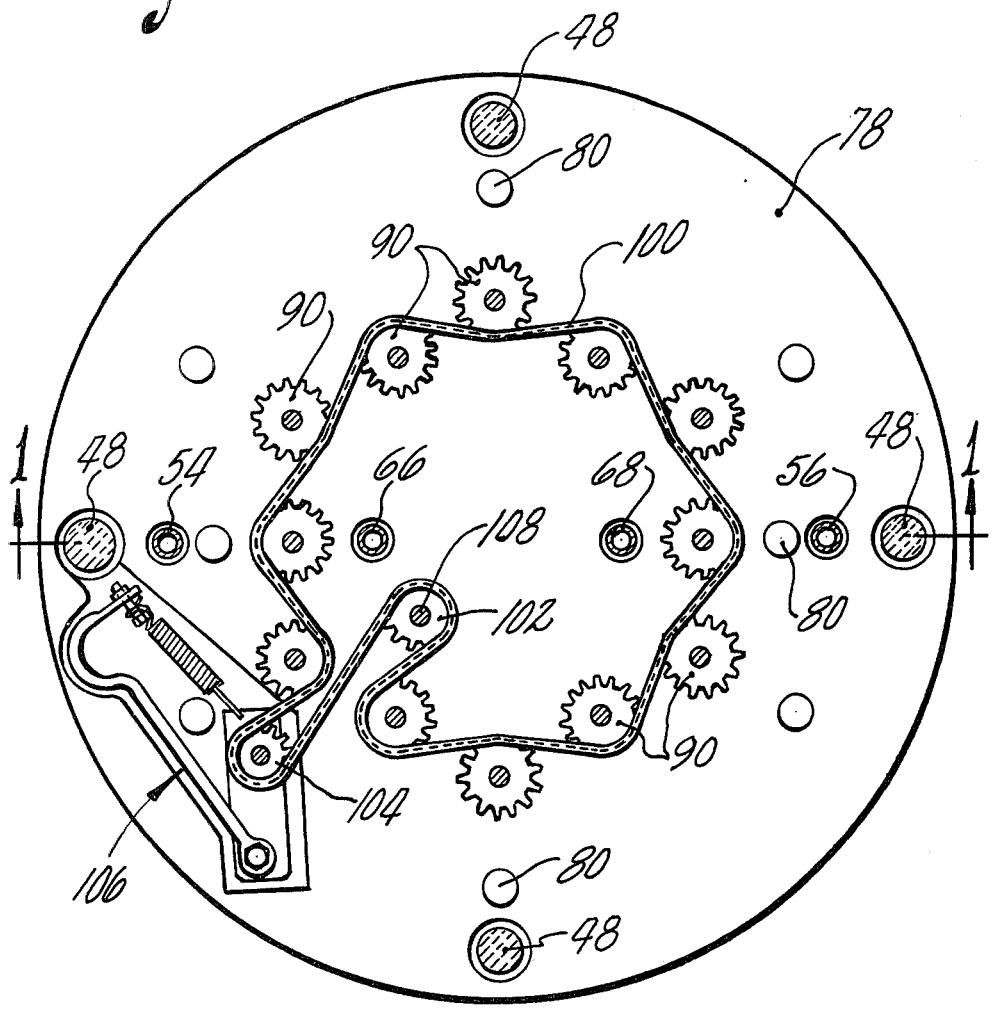
FIG. 2 is a cross-sectional view taken along the line 2—2 of FIG. 1.
Figure 3:
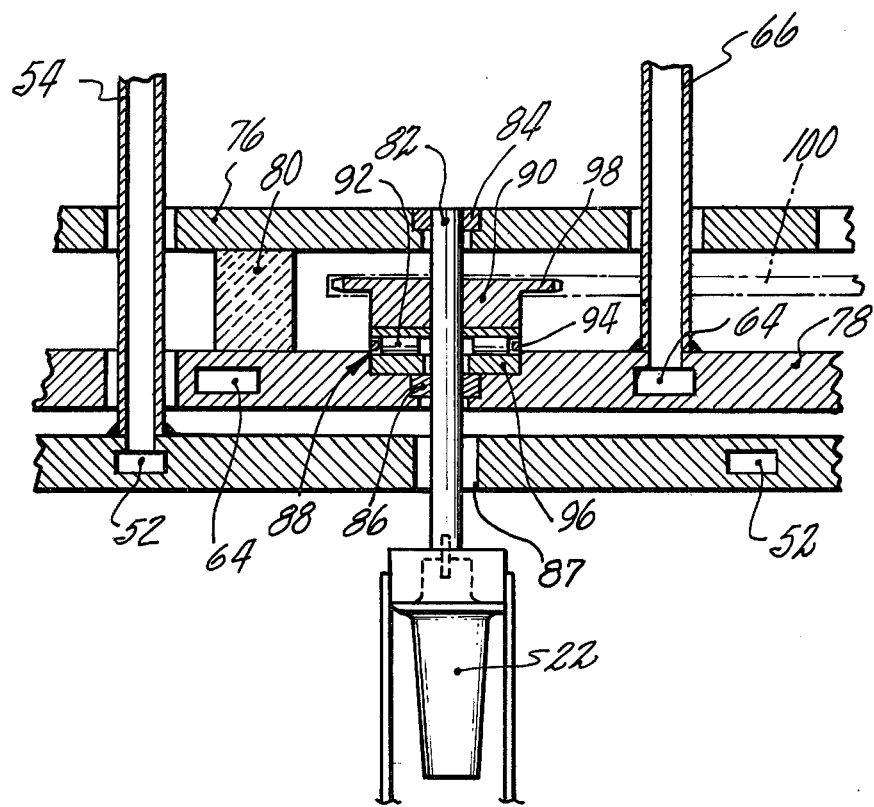
FIG. 3 is an enlarged view of a portion of FIG. 1 showing certain aspects of the present invention in better detail.

An exemplary embodiment of the present invention is illustrated in FIGS. 1-3. As best shown in FIG. 1, cathode sputtering apparatus comprises a housing 12 defining a vacuum chamber 14. Disposed within the vacuum chamber 14 is electrode means 16 defining a cathode sputtering zone 18, and, article support means 20 for rotatably holding articles 22 to be coated within the sputtering zone 18.

The housing 12 comprises a base plate 24, a cylindrical wall 26, and a detachable top plate 28. Supply means 30 is adapted to flow working medium gases into the vacuum chamber 14, including the sputtering zone 18. Discharge means 32 is adapted to evacuate the chamber 14. An electrical coil 34 is wrapped around the outer periphery of the wall 26, and is adapted to impose a magnetic field within the sputtering zone 18.

The electrode means 16 comprises a center, post cathode 38, a hollow cylindrical cathode 40, an anode plate 46, and a ground plate 50. The sputtering zone 18 is the annular space between the cathodes 38, 40. The center, post cathode is a can-like structure encased by a thick layer of sputtering material 42. The cylindrical cathode 40 has a thick layer of sputtering material 44 on the inner surface thereof. A ground plate 50 at the bottom of the sputtering zone 18 is electrically grounded to the housing base plate 24 through hollow, fluid cooled rods 60, and is supported above the base plate via a plurality of metal shields 61. The cylindrical cathode 40 is supported above the ground plate 50 and base plate 24 through insulating posts 36 and pins 37. The center, post cathode 38 is supported on and electrically insulated from the ground plate 50 by a plurality of insulating pillars 39. Both the cathodes 38, 40 are, however, electrically connected to the ground plate 50 by other means not shown. The cathode 40 has passages 41 in the walls thereof through which a cooling medium is flowable via a supply conduit 47. The post cathode 38 has a cooling reservoir 43. The reservoir 43 is fed by an inlet conduit 45. Cooling fluid leaves the reservoir via an outlet conduit 49.

Disposed above the sputtering zone 18 and spaced from the cathodes 38, 40 is the anode plate 46. The anode plate 46 is supported from and secured to the housing top plate 28 by a plurality of insulating posts 48. Anode plate cooling channels 52 are supplied with a cooling fluid via an inlet conduit 54 which, when desired, also carries electric current from a source not shown to the anode plate. Cooling fluid leaves the anode plate 46 via an outlet conduit 56.

The ground plate 50 also includes cooling channels 58 which are fed by a supply conduit 60. Cooling fluid leaves the ground plate by a similar conduit which is not shown. Disposed beneath the ground plate 50 is a filament 72 of the type adapted for the thermionic emission of electrons. The electrons enter the sputtering zone 18 by way of a plurality of apertures 74 in the ground plate 50.

The article support means 20 comprises a thermally conductive upper bearing plate 76 spaced from an electrically conductive lower bearing support plate 78 by means of a plurality of cylindrical spacers 80 which are securely fastened to both plates by bolts or other suitable means. The lower bearing support plate 78 includes cooling channels 64 which are supplied with a cooling fluid via an inlet conduit 66. The conduit 66, when desired, also serves to carry an electric current from a suitable source (not shown) into the plate 78 for biasing the articles to be coated. Cooling fluid leaves the plate 78 via an outlet conduit 68. The spacers 80 between the plates 76, 78 must be highly thermally conductive such that heat is readily transferred therebetween thereby minimizing the temperature gradient between these two plates, which is critical to maintaining alignment between the upper bushing 84 and the lower bushing 86 (FIG. 3).

As best shown in FIG. 3, a plurality of electrically conductive article support shafts 82 each pass vertically through and are rotatable within radial load bearings which, in this embodiment, are bushings 84, 86 disposed within the plates 76, 78, respectively. The lower ends of the article support shafts 82 extend into the cathode sputtering zone 18 through apertures 87 in the anode plate 46. The articles 22 are secured to the ends of the shafts 82 and rotate within the sputtering zone 18 as the shafts 82 are rotated.

Between the bushings 84, 86 is an electrically conductive thrust bearing 88 supported by the plate 78. The thrust bearing 88 comprises an upper race 90, cylindrical rollers 92 disposed in a cage 94, and a lower race 96 which fits into an indentation in the plate 78. The shaft 82 fits tightly and locks within the upper race 90, which is also a gear with outwardly extending gear teeth or sprockets 98. A continuous chain 100, best shown in FIG. 2, engages the sprockets 98 of all the gears, including a drive or pilot gear 102 and an idler gear 104, the idler gear being connected to a mechanism 106 which maintains tension in the chain 100. A pilot gear drive shaft 108 extends out of the vacuum chamber through a vacuum rotary feedthrough in the housing top plate 28 and is connected to a suitable motor which is not shown. By rotating this drive shaft, all the article support shafts are simultaneously rotated.

In this apparatus, current can be brought either (1) to the anode plate 46 via the conduit 54 or (2) to the bearing support plate 78 via the conduit 66 to bias the articles 22, or (3) to both simultaneously. In accordance with the teaching of the present invention, if the articles are to be biased then the thrust bearings must present the path of least electrical resistance to the shaft 82, such that, relatively speaking, almost no current passes through the bushings. Thus, the bushings may be made from any materials which (1) have high electrical resistivity relative to the thrust bearing materials, (2) provide lubricity without using oils or greases, and (3) are conducive to operating in a partial vacuum without outgassing or disassociation.

Not only must the thrust bearings provide the path of least electrical resistance, but, as has been previously discussed, it is also required that they be unlubricated and operate in a partial vacuum. Even with no current passing through them the temperature in their vicinity within the vacuum chamber will be at least 540° C. Under these circumstances they must offer very little resistance to the flow of current or they will quickly overheat and bind. Also, they must have a high surface hardness and high melting point. In accordance with the present invention, it is critical that the thrust bearing components have a surface hardness of at least 190 Brinell and preferably at least 443 Brinell. Also, electrical resistivity must be no greater than 6.0 microohm-cm; and the materials must have a melting point of at least 2000° C. and preferably at least 2600° C. The combination of these three characteristics satisfactorily minimize wear, prevent unacceptable temperature increases (due to the electric current passing therethrough into the shafts), and prevent arc welding of the bearing components.

Two materials which satisfy these criteria are tungsten and molybdenum; and it is preferred that the rolling elements 92, the races 90, 96, and the shafts 82 each include at least an outer layer of tungsten or molybdenum. A suitable material for the cages 94 and the bushings 84, 86 would be a mixture of graphitized carbon (for lubricity) and silver (for hardness).

Although the invention has been shown and described with respect to preferred embodiments thereof, it should be understood by those skilled in the art that various changes and omissions in the form and detail thereof may be made therein without departing from the spirit and the scope of the invention.

I claim:

1. In cathode sputtering apparatus for depositing a coating on the surface of an article, including means defining a vacuum chamber, first and second spaced apart sacrificial cathode means disposed in said vacuum chamber defining a sputtering zone therebetween, anode means spaced from said cathode means and disposed in said vacuum chamber, means for discharging electrons into said sputtering zone, article support means for supporting the article to be coated within said sputtering zone and for permitting rotation of the article about an axis, and electrical potential generating means interconnected to said support means for passing an electric current through said support means to the article to be coated, the improvement comprising:

said article support means being disposed within said vacuum chamber and including electrically conductive support plate means, an electrically conductive shaft having an axis, and shaft bearing means comprising a plurality of bearings at least one of which is an electrically conductive non-lubricated thrust bearing, said shaft including article attachment means for securing the article to be coated to said shaft, wherein said shaft passes through, is supported by, and is in contact with said plurality of bearings for rotation about said shaft axis, and said thrust bearing is supported by and is in electrical contact with said support plate means, and wherein said thrust bearing includes a fixed race, a rotating race, and rolling elements disposed between said races, said races and elements each having an electrical resistivity of less than 6.0 microohms-cm, a surface harness of at least 190 Brinell, and a melting point of at least 2000° C.

2. The improved cathode sputtering apparatus according to claim 1 wherein said rolling elements, said fixed and rotating races, and said shaft each include at least an outer layer of tungsten or molybdenum.

3. The improved cathode sputtering apparatus according to claim 1 wherein said rolling elements, said fixed and rotating races, and said shaft are made from a material selected from the group consisting of tungsten and molybdenum.

4. The improved cathode sputtering apparatus according to claims 2 or 3 wherein said support plate means comprises a lower support plate and an upper support plate, said upper and lower plates being spaced apart by thermally conductive spacer means which provides a heat transfer path therebetween, and said shaft bearing means includes upper and lower radial load bearings, said upper radial load bearing being secured to said upper plate and said lower radial load bearing being secured to said lower plate, said thrust bearing being disposed between said upper and lower bearings and having its fixed race in supporting and electrical contact with said lower plate, said rotating race being fixed relative to said shaft and in electrical contact therewith;

wherein the path of least resistance for the electric current from said generating means to said shaft is through said lower support plate, to said thrust bearing fixed race, to said rolling elements, to said thrust bearing rotating race, and into said shaft.

5. The improved cathode sputtering apparatus according to claim 4 wherein said upper and lower bearings are bushings comprising a mixture of graphitized carbon and silver.

* * * * *